US005682675A

United States Patent [19]

Hirota

[11] Patent Number: 5,682,675

[45] Date of Patent: Nov. 4, 1997

[54] APPARATUS AND METHOD OF MOUNTING ELECTRONIC COMPONENTS

[75] Inventor: Kazuyuki Hirota, Fukuoka, Japan

[73] Assignee: Matsushita Electric Industrial Co., Ltd., Osaka, Japan

[21] Appl. No.: 425,781

[22] Filed: Apr. 20, 1995

[30] Foreign Application Priority Data

Apr. 20, 1994 [JP] Japan .................................... 6-081530

[51] Int. Cl.$^{6}$ ........................................................ H05K 3/34

[52] U.S. Cl. ................................ 29/840; 29/740; 29/741; 29/743; 29/836; 29/843; 228/180.21; 294/64.1

[58] Field of Search ............................. 29/593, 740, 741, 29/743, 836, 840, 843; 228/180.21, 180.22; 294/2, 64.1

[56] References Cited

U.S. PATENT DOCUMENTS

| | | | |
|---|---|---|---|
| 4,505,035 | 3/1985 | Burton et al. | 29/843 |
| 4,700,877 | 10/1987 | Dodds et al. | 29/843 X |
| 4,769,883 | 9/1988 | Nathanson et al. | 29/593 X |
| 4,951,383 | 8/1990 | Amao et al. | 29/743 X |
| 4,989,318 | 2/1991 | Utunomiya et al. | 228/180.21 X |
| 5,086,559 | 2/1992 | Akatsuchi | 29/740 X |
| 5,501,005 | 3/1996 | Onitsuka | 29/840 X |

*Primary Examiner*—Peter Vo

*Attorney, Agent, or Firm*—McDermott, Will & Emery

[57] ABSTRACT

A PC board is placed at a specified position by means of a positioning device, and an electronic component to be affixed to a side of the PC board is supplied to a parts holding device by means of a carrying head. The parts holding device holds the electronic component with terminal leads of the electronic component facing to a side of the PC board, and the parts holding device is moved towards the PC board to affix the terminal leads of the electronic component to the side of PC board. Thus, terminals of the electronic component such as connector, for example, may be automatically mounted to a side of a PC board.

8 Claims, 6 Drawing Sheets

APPARATUS AND METHOD OF MOUNTING ELECTRONIC COMPONENTS

FIELD OF THE INVENTION

This invention relates to an apparatus and method of mounting a terminal of an electronic component to a side of a printed circuit board (PC board).

BACKGROUND OF THE INVENTION

On a PC board, surface molding type components are mounted on a face or reverse surface of the PC board, and inserting type components are mounted by inserting their lead terminals into through-holes of the PC board. Besides these types of components, among the electronic components to be mounted on a PC board, there is a special type connector, for example, whose terminal leads are positioned almost in parallel with the PC board and are designed to clamp onto a side margin of the PC board.

The method of mounting this type of electronic component on a PC board is described below, referring to FIG. 6 and FIG. 7. FIG. 6 is perspective view explaining a conventional method of mounting the electronic component. FIG. 7 is a side view of a conventional process of mounting the electronic component.

As shown in FIG. 6, a PC board 1 has plurality of terminal electrodes **1*b* at the side margin 1*a* of PC board 1. Electronic component 2, a connector for example, is affixed to, and in parallel with the PC board 1 by clamping the side margin 1*a* of PC board 1 from the top and bottom, and the terminal leads 3, 4 are electrically connected with the terminal electrodes 1*b*. There have been a number of such mounting apparatus for electronic components which mount the above mentioned surface molding type components and the inserting type components on a PC board 1 in the direction of thickness (i.e. perpendicular to the PC board 1). However, no apparatus has been devised which mounts an electronic component 2 to the PC board 1 by transferring the electronic component 2 in the direction parallel to the PC board 1 to have the terminal leads 3, 4 of electronic component 2 affixed to the side margin 1*a* of the PC board 1**.

The mounting process as illustrated in FIG. 7 has to this point only been performed manually. In such case, however, the operation efficiency is low and the total mechanization of the mounting process of electronic components is unimplementable.

SUMMARY OF THE INVENTION

The objective of this invention is to offer an apparatus and method of automatically mounting on a PC board such electronic components that have terminals designed to be affixed to a side margin of a PC board.

The electronic components mounting apparatus of this invention comprises a positioning device for fixing the PC board to a certain position, a parts holding device for holding the electronic components with their terminal leads to be affixed to the side margin of PC board such that the terminal leads face the side margin of the PC board, a feeding device for feeding electronic components to the said parts holding device, and a transfer device for transferring the parts holding device towards the PC board in order to have the terminal of the electronic components affixed to the side margin of the PC board.

Under the above mentioned construction, a PC board is placed at a specified location by means of the positioning device. Electronic components are supplied to the parts holding device by means of the feeding device, and the parts holding device holds the electronic components with their terminal leads facing to the side margin of the PC board. Then, the transfer device is actuated to transfer the electronic components towards the PC board, and the terminal leads of electronic components are affixed to the side margin of the PC board. In this way, the electronic components are automatically affixed to, and in parallel with, the PC board.

As pointed out in greater detail below, this invention provides a means whereby the mounting process can be totally automated; thus, increasing the operating efficiency.

The invention itself, together with further objects and attendant advantages, will be best understood by reference to the following detailed description taken in conjunction with the accompanying drawings.

DESCRIPTION OF THE PREFERRED EMBODIMENTS

Figure 6:
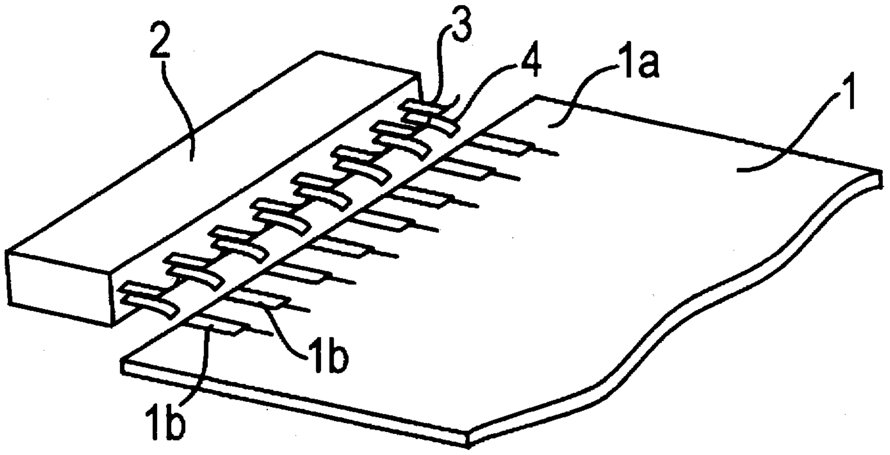
FIG. 6 PRIOR ART
FIG. 6 is a perspective view of a conventional process of mounting an electronic component.
Figure 7:
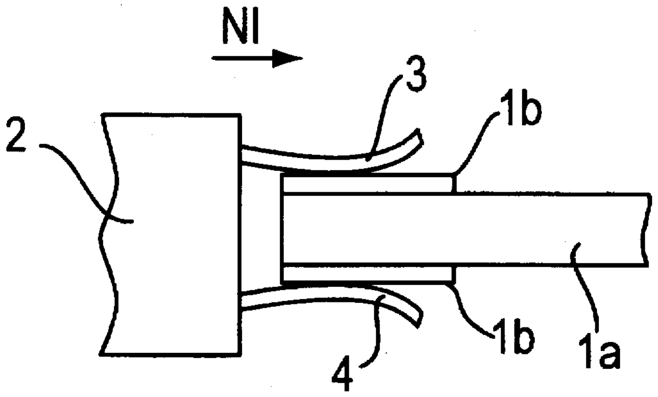
FIG. 7 PRIOR ART
FIG. 7 is a side view of a conventional process of mounting an electronic component.

A first embodiment of this invention is described below referring to FIG. 1 and FIG. 2. The constituent parts having the same function as in the conventional device of FIG. 6 are given the same reference numerals and their explanations are omitted.

Figure 1:
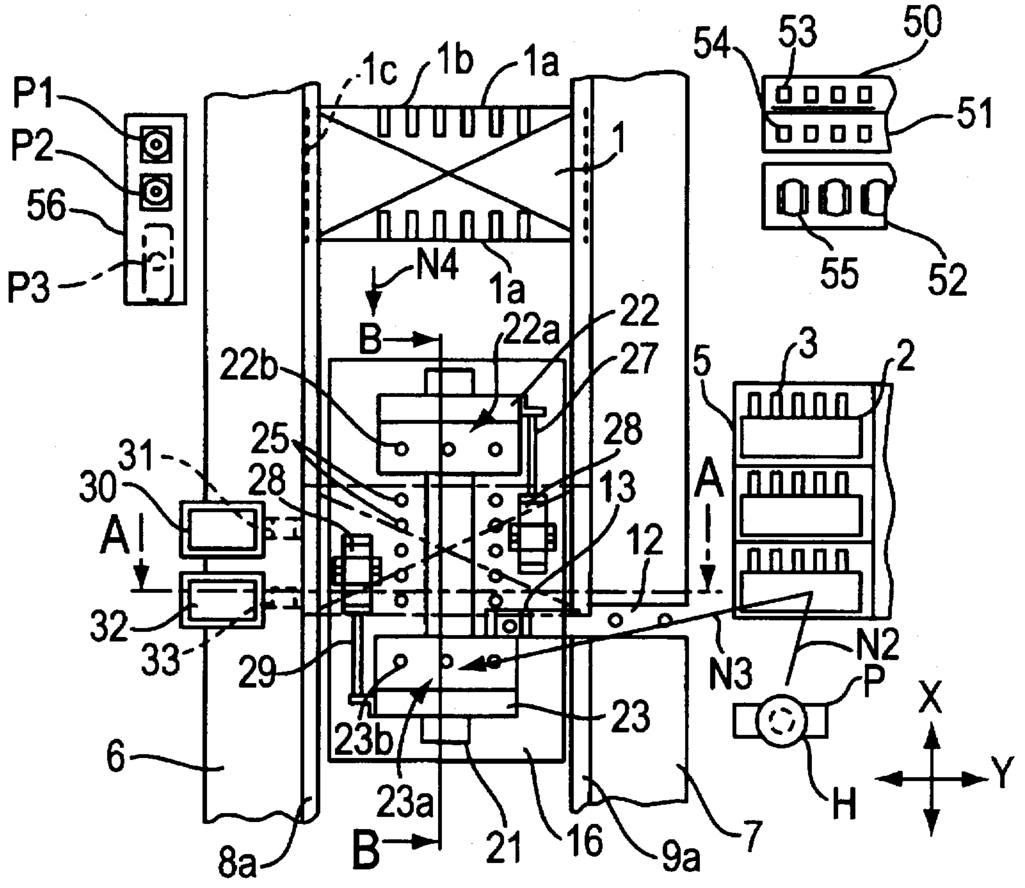
FIG. 1 is a top view of an electronic components mounting apparatus according to a first embodiment of this invention.

FIG. 1 is a top view of an electronic component mounting apparatus according to the first embodiment of this invention. FIG. 2 is a cross-sectional view (at A—A line in FIG. 1) of this apparatus.

Figure 3A:
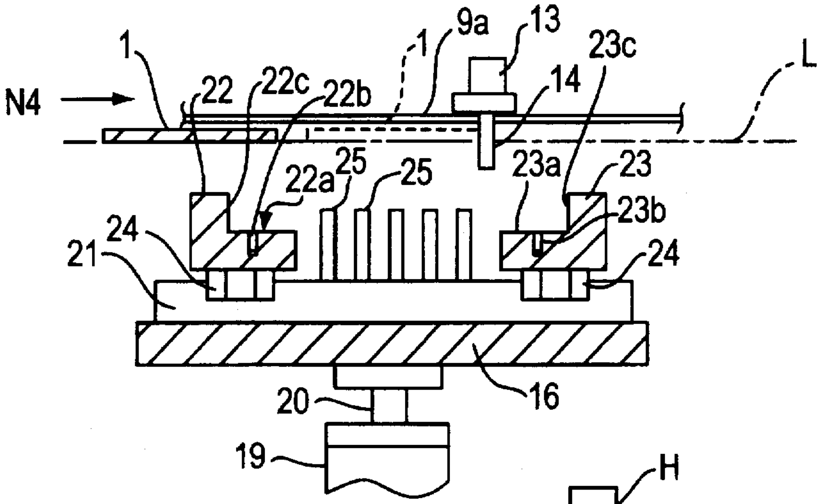
FIGS. 3(*a*)–(*c*) explain the operation of the mounting apparatus of the first embodiment of this invention.
Figure 3B:
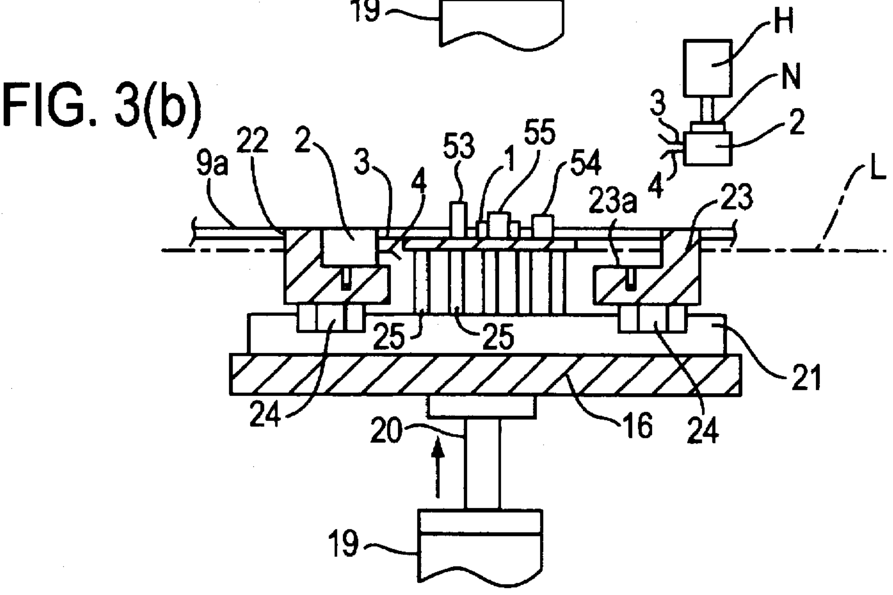
Figure 3C:
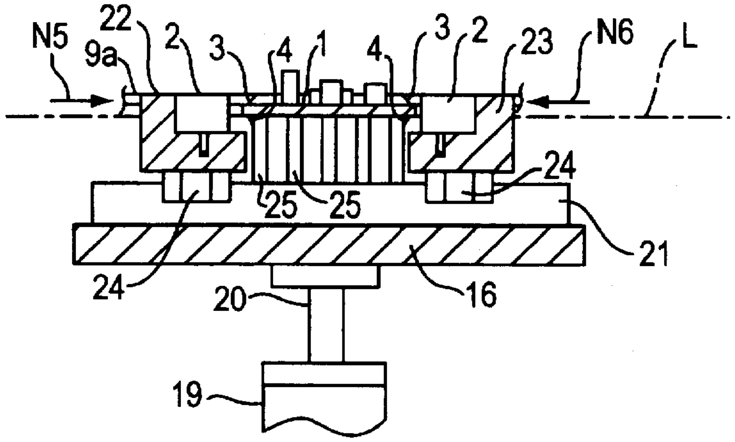

As shown in FIG. 1, a tray (first storage means) 5 houses an electronic component 2 having terminal leads 3, 4 (See FIG. 3(*b*)). A plurality of tape feeders (second storage means) 50, 51, 52 house surface molding type electronic components 53, 54, 55 to be mounted on the surface of a PC board 1. A suction pad storage 56 houses a plurality of suction pads (nozzles) P1, P2, P3. A carrying head H uses one of the suction pads P1, P2, P3 to pick up the electronic component 2 out of the tray 5 and carry it to an electronic component holding block, which will be described later. The head also picks up surface molding type electronic components 53, 54, 55, housed in the tape feeders 50, 51, 52, and mounts them on specified points of the surface of the PC board 1. In this embodiment, the carrying head H corresponds to the feeding device, which carries electronic components 2 to the electronic component holding block.

Figure 2:
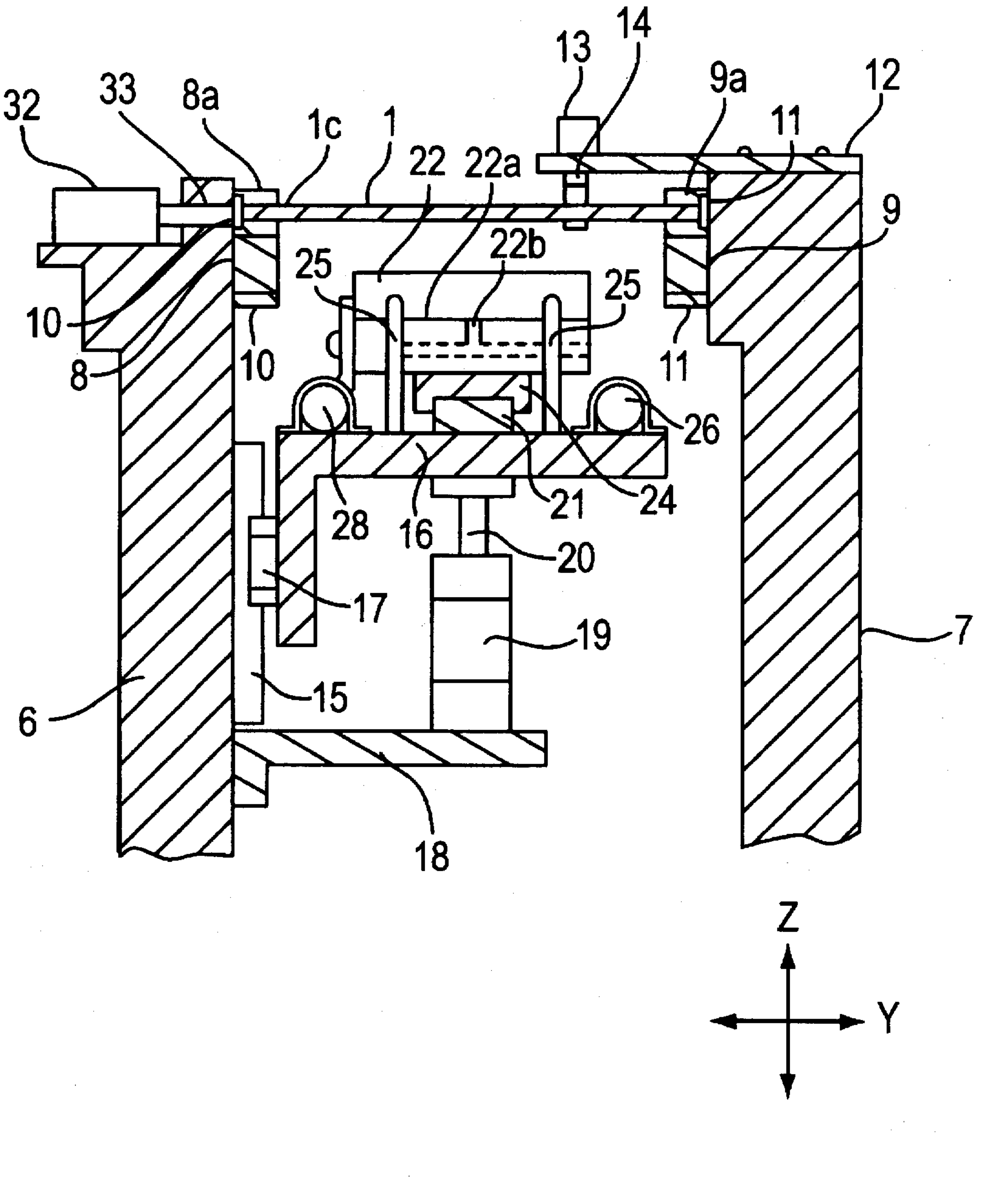
FIG. 2 is a cross-sectional view of the mounting apparatus of the first embodiment of this invention along the line A—A.

A first base structure 6 and a second base structure 7 of the apparatus stand with a certain clearance in parallel with the line X, being the transfer line of the PC board 1, as shown in FIG. 2. As shown in FIG. 2, a first PC board guide 8 is to support the side 1*c* of the PC board 1 and is attached horizontally to the first base structure 6. The first PC board guide 8 is equipped with a belt 10, which corresponds to the carrying device for the PC board 1. A second PC board guide 9 is attached horizontally, and at the same height as the first PC board guide 8, to the second base structure 7. The PC board guide 9 is equipped with a belt 11, which corresponds to the carrying device, in the same manner as the first PC board guide 8. When the belts 10, 11 are driven by a driving means, such as a motor or other drivers known to those skilled in the art (not shown), the PC board 1 is transferred in the direction N4 (FIG. 1), guided by the first PC board guide 8 and the second PC board guide 9. In this embodiment, the first base structure 6, the first PC board guide 8, the second base structure 7 and the second PC board guide 9 correspond to the guiding device which guides the PC board 1 on the transfer level L (see FIGS. 3(*a*)–(*c*)).

The PC board 1 is transferred, as shown in FIG. 1, lying like a bridge with the sides 1*a*, on which there are terminal electrodes 1*b*, supported between the first PC board guide 8 and the second PC board guide 9, while the sides 1*c*, having no terminal electrode 1*b*, are held with the first PC board guide 8 and the second PC board guide 9. The electrodes 1*b* and other electrodes on which surface molding type electronic components are to be soldered, are precoated or printed with solder.

As shown in FIG. 2, there is a first PC board suppressor 8*a* attached on the upper part of the first base structure 6 in parallel with the top surface of the PC board guide 8; and a second PC board suppressor 9*a* on the upper part of the second base structure 7 in parallel with the top surface of the second PC board guide 9. The first PC board suppressor 8*a* and second PC board suppressor 9*a* are intended to fix the position of PC board 1 in terms of height, when bottom support pins (to be explained later) push the PC board 1 up. Arm 12 is installed on the second base structure 7 and extends in the Y direction. At the end of arm 12 is a stopper 13 made up of a downward cylinder, from which a stop bar 14 pops out in the Z direction to stop the PC board 1 when it is transferred from the position as indicated with solid lines in FIG. 1 to the position as indicated with dotted lines; thus the PC board 1 is fixed in a specified position in terms of the X direction. A clamper 32 is installed on the first base structure 6, and is intended to thrust a clamp bar 33 which is loosely installed on the first base structure 6. Likewise, there is a clamper 30 combined with a clamp bar 31. When the PC board 1 is stopped at the specified position, the clampers 30, 32 are actuated to push the clamp bars 31, 33; these bars touch and press the side of the PC board 1 positioned in parallel with the X direction, and the PC board 1 is fixed in the right position with respect to the Y direction.

As shown in FIG. 2, there is an elevator guide 15 fixed in the Z direction, at a lower part of the first base structure 6 on the surface facing the second base structure 7. On the elevator guide 15, there is a slider 17, on which a first bracket 16 of reverse L shape is fixed. Namely, the first bracket 16 is installed to be able to move up and down the transfer level L (see FIG. 3) of the PC board 1. In addition, a second bracket 18 is installed on the first base structure 6, and cylinder 19 is fixed on the second bracket 18 with a rod 20 attached to the cylinder 19 in an upward direction. The top end of rod 20 is connected to the bottom of the first bracket 16. Therefore, by actuating the cylinder 19, the first bracket 16 may be shifted up and down with respect to the transfer level L. The cylinder 19 corresponds to the elevation device, which moves the first bracket 16 up and down, therefore it can be replaced with a combination of a transfer screw, nut and driving motor to produce the same operation.

Further, as shown in FIG. 1, a plurality of bottom support pins 25 are mounted on the first bracket 16, which give support to the bottom of the PC board 1 when it is transferred to a specified position. The bottom support pins 25 correspond to the bottom support device. When the bracket 16 is elevated by the cylinder 19 and the rod 20, the bottom support pins 25 push the PC board up, and upper surface of the PC board 1 touches the bottom surfaces of first PC board suppressor 8*a* and second PC board suppressor 9*a* at the side margins 1*c*; in this way, positioning of the PC board 1 with respect to the height, and correction of any warping of the PC board 1 are carried out. In this embodiment, the first PC board guide 8, the second PC board guide 9, the first PC board suppressor 8*a*, the second PC board suppressor 9*a*, the stopper 13, the clamper 30 and the bottom support pins 25 correspond to the positioning device for the PC board 1.

Returning to FIG. 2, fixed along the X direction in the center of first bracket 16 is X guide 21, and a pair of sliders 24 (also see FIG. 3(*a*)) are installed on the X guide 21. A pair of electronic component holding blocks 22, 23 for holding electronic components having L shape cross sections are attached on the sliders 24. (Also see FIG. 3(*a*)). The flat deck of the electronic component holding blocks 22, 23 are intended to work as suction plates 22*a*, 23*a* to suck the bottom surface of a electronic component(s) 2, and are provided with suction holes 22*b*, 23*b* from which the air is sucked by a sucking means, such as a vacuum or other well known device (not shown). As shown in FIG. 3(*a*), vertical faces 22*c*, 23*c* of the electronic component holding blocks 22, 23 are to touch the electronic component(s) 2 at the surface having no terminal leads 3, 4 (hereinafter referred to as the back surface). When the electronic component(s) 2 is to be affixed to the PC board 1, the vertical faces 22*c*, 23*c* push the back surface of the electronic component(s) 2 towards the PC board 1 for insertion. These electronic component holding blocks 22, 23 are elevated up and down the transfer level L by the operation of cylinder 19, so that they do not interfere with the transfer of the PC board 1. Namely, when the PC board 1 is to move, the electronic component holding blocks 22, 23 are withdrawn underneath the transfer level L, and when the electronic component(s) 2 is to be affixed, the holding blocks are elevated to the transfer level L. In this embodiment, the electronic component holding blocks 22, 23 correspond to the parts holding device.

A cylinder 26 is fixed on the first bracket 16, and a rod 27 (FIG. 1) of the cylinder 26 is connected with the electronic component holding block 22. In the same manner, the electronic component holding block 23 is connected with a rod 29 of a cylinder 28. When electronic component(s) 2 is placed on the electronic component holding blocks 22, 23 and sucked by the suction plates 22*a*, 23*a*, and then the cylinders 26, 28 are actuated to make the rods 27, 29 retract, the terminal leads 3, 4 of electronic component(s) 2 approach the side margin(s) 1*a* of the PC board 1 which is already at the specified position; and the electronic component(s) is affixed to the PC board 1. The cylinders 26, 28 correspond to the transfer device.

The operation of an electronic component mounting apparatus according to the first embodiment is describe below, referring to FIGS. 3(*a*)–(*c*). FIGS. 3(*a*)–(*c*) illustrate the operation of an electronic component mounting apparatus according to the first embodiment, as observed along the line B—B in FIG. 1.

The PC board 1 as indicated with solid lines in FIG. 3(*a*) is transferred in the direction N4 by belts 10, 11 driven by a driving means (not shown). Before the PC board 1 reaches the position as indicated with dotted lines in FIG. 3(*a*), the stopper 13 is actuated to extend the stop bar 14 downward. The PC board 1 is stopped by the stop bar 14 when the side of the PC board 1 along the Y direction touches the stop bar 14. The PC board 1 is positioned at a specified position with respect to the X direction as described above with reference to FIG. 2. Next, the clamper 30, 32 are actuated to drive forward the clamp bars 31, 33 to touch the side of PC board 1 along the X direction. (FIG. 1) The PC board 1 is positioned at a right position with respect to the Y direction. During the transfer of PC board 1, the bottom support pins 25 and the electronic component holding blocks 22, 23 are kept lower than the transfer level L by retracting the rod 20 of cylinder 19, in order not to disturb the moving of the PC board 1.

Then, as shown in FIG. 3(*b*), cylinder 19 is actuated to drive the rod 20 up; the top end of bottom support pins 25 touches to the bottom surface of PC board 1 to push it upward. The upper surface of the PC board 1 is pressed at its side edges 1*c* to the first PC board suppressor 8*a* and the second PC board suppressor 9*a*. The PC board 1 is thus positioned at the right position with respect to the Z direction. Along with the elevation of bottom support pins 25, the electronic component holding blocks 22, 23 are also on the transfer level L.

Next, the stop bar 14 of the stopper 13 is withdrawn from the transfer level L. The surface molding type electronic components 53, 54, 55 are mounted on the surface of PC board 1 by the action of carrying head H. The carrying head H chooses either suction pad P1 or P2, in accordance with the shape of the surface molding type electronic components to be mounted. After mounting of all the surface molding type electronic components is completed, the carrying head H puts on the suction pad P3, and picks up the electronic component(s) 2 out of tray 5 to carry it on the suction plates 22*a*, 23*a* of the electronic component holding blocks 22, 23. The electronic component(s) 2 is placed so that its terminal leads 3, 4 face to the side of PC board 1. The positioning of terminal electrode 1*b* of PC board 1 in terms of Y direction and that of terminal leads 3, 4 of electronic component(s) 2 in terms of Y direction are adjusted to meet by the carrying head H. When the air is sucked through the sucking holes 22*b*, 23*b* by a suction means (not shown), the electronic component(s) 2 sticks to the suction plates 22*a*, 23*a*.

As shown in FIG. 3(*c*), the terminal leads 3, 4 of electronic component(s) 2 are affixed to the side(s) of PC board 1 when the cylinders 26, 28 are actuated to retract rods 27, 29, which drive the electronic component holding blocks 22, 23 in the directions of N5, N6, respectively.

After the mounting or affixing of electronic components in this electronic component mounting apparatus is finished, the PC board 1 is transferred by the belts 10, 11 to be carried out of the first PC board guide 8 and the second PC board guide 9, and is sent to a reflow bath (not shown). In the reflow bath, the electronic component(s) 2 and surface molding type electronic components 53, 54, 55 are soldered to the PC board 1, by melting the solder precoated or printed on the PC board 1.

Figure 4:
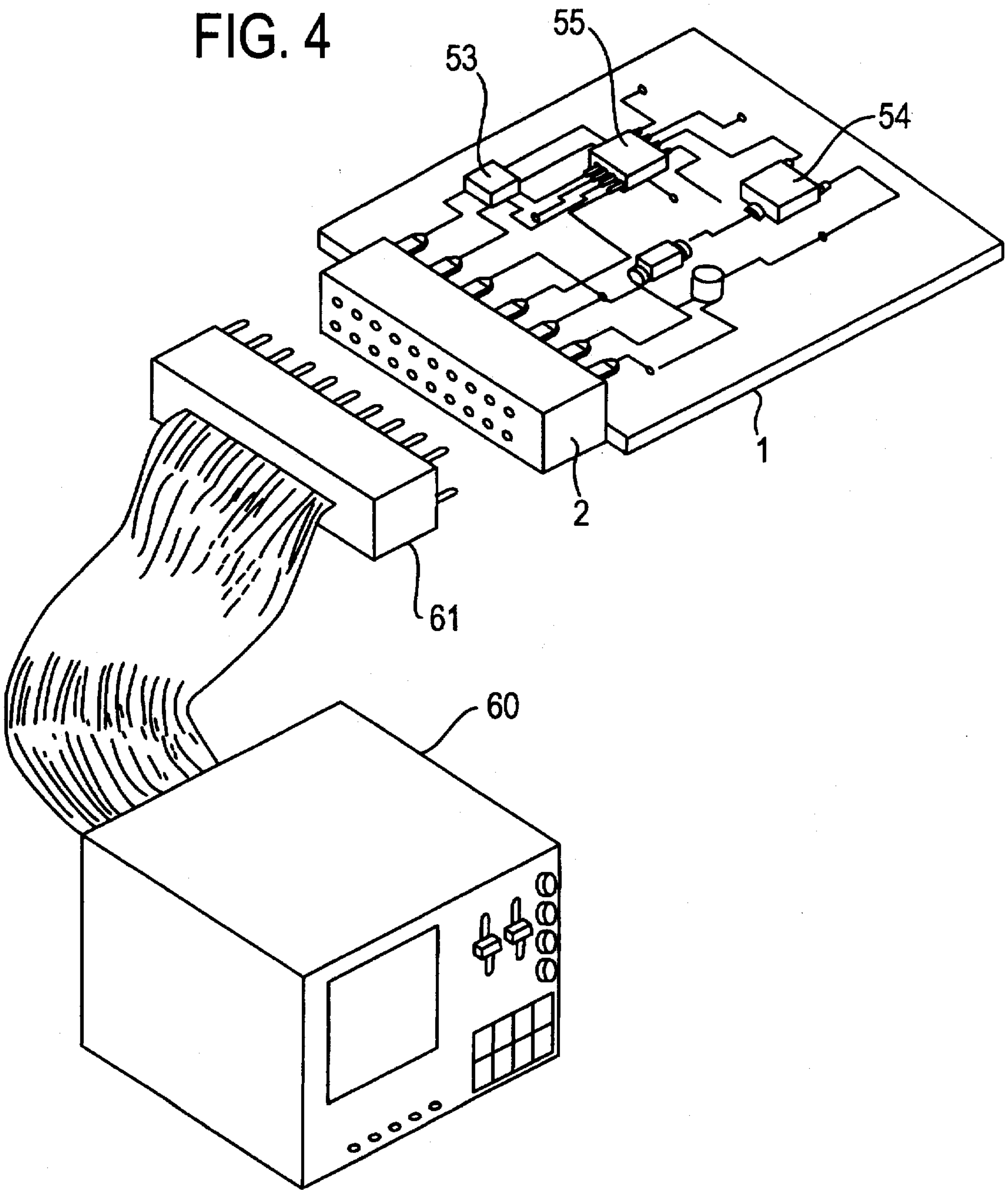
FIG. 4 illustrates the inspection of a PC board mounted with electronic components according to the first embodiment of this invention.

The next step is to electrically inspect the soldered PC board 1, as illustrated in FIG. 4. It is well known that connectors or other devices can serve as the electronic component 2 to be affixed to a side of PC board 1. In the present case, a connector is used as an example; where, the PC board 1 and inspection unit 60 can easily be connected by simply inserting plug 61 of the inspection unit 60 to the connector (electronic component) 2. This makes it possible to conduct electrical inspection immediately after soldering.

According to the first embodiment, electronic components like the ones whose terminals are to be affixed to a side of a PC board can be automatically mounted on a PC board. In addition, the operation of affixing electronic components to a side of a PC board and that of mounting the surface molding type electronic components on a surface of a PC board may be done automatically on one electronic component mounting apparatus.

Figure 5A:
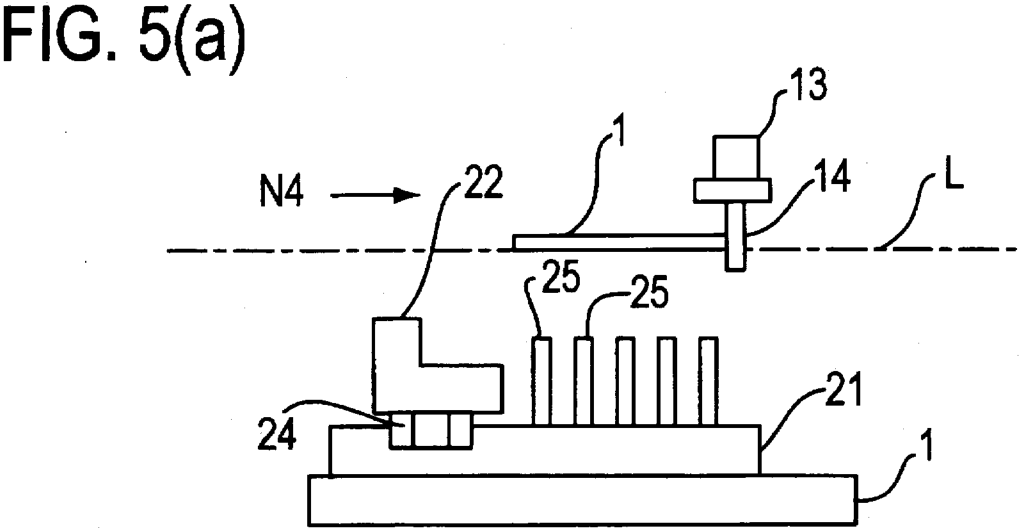
FIGS. 5(*a*)–(*c*) explain the operation of an electronic components mounting apparatus according to a second embodiment of this invention.
Figure 5B:
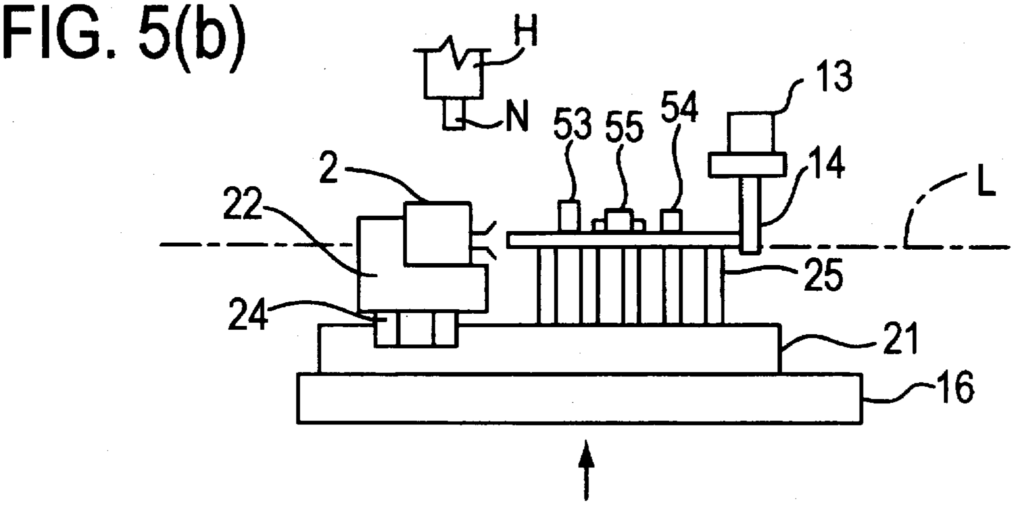
Figure 5C:
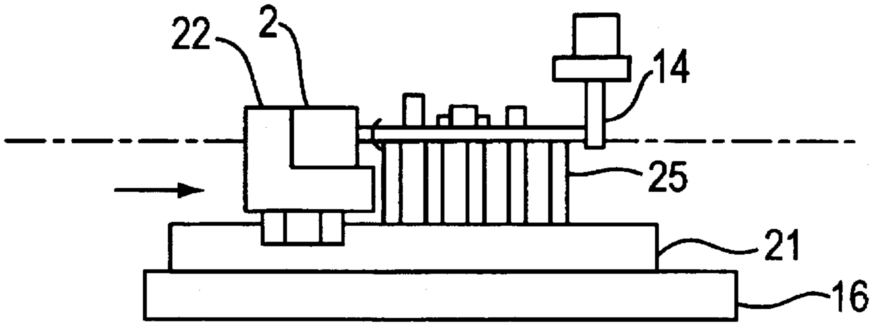

A second embodiment of this invention will be described with reference to FIGS. 5(*a*)–(*c*).

The second embodiment differs from the first embodiment only in that the electronic component holding block 23 and the cylinder 28 are eliminated in the second embodiment; the rest remains the same. Namely, in the first embodiment, the electronic components 2 are affixed to two side-margins 1*a*, 1*a* of the PC board 1, while in the second embodiment, the electronic component 2 is affixed to one side-margin.

The operation of an electronic component mounting apparatus according to this embodiment is described below, referring to FIGS. 5(*a*)–(*c*). As shown in FIG. 5(*a*), the positioning of the PC board 1 in terms of the X direction is conducted by thrusting the stop bar 14 of stopper 13 down below the transfer level L to stop the PC board 1 from being transferred in the direction N4. Then, the clampers 30, 32 are actuated to make the clamp bars 31, 33 touch and press the side 1*c* of PC board 1, to fix it at the right position in terms of the Y direction. Then, the bottom support pins 25 are raised to fix the PC board 1 at the right position in terms of the direction Z. Thus far, the operation is the same as in the first embodiment.

Next, the carrying head H mounts the surface mounting type electronic components 53, 54, 55, and supplies the electronic component 2 to the electronic component holding block 22. In the meantime, the stop bar 14 of stopper 13 is kept extended below the transfer level L. Then, as shown in FIG. 5(*c*), the cylinder 26 is actuated to move the electronic component holding block 22 towards the side 1*a* of PC board 1, and the electronic component 2 is affixed. At this time, a right-ward force is applied to the PC board 1, however the stop bar 14 prevents it from moving to the direction X.

The embodiments described above provide a number of significant advantages. For example, the device of this invention totally automates the procedure for mounting electronic components on a printed circuit board. This automation increases the throughput and efficiency of the process because prior to this invention the process had to be performed manually.

Of course, it should be understood that a wide range of changes and modifications can be made to the preferred embodiments described above. It is therefore intended that the foregoing detailed description be regarded as illustrative rather than limiting, and that it be understood that it is the following claims, including all equivalents, which are intended to define the scope of this invention.

What is claimed is:

1. An apparatus for mounting electric components to a PC board, each electronic component having at least a pair of terminal leads facing each other with said PC board having at least a pair of terminal electrodes positioned opposite each other on opposite surfaces of said PC board at a side margin thereof, comprising:

a positioning device for positioning said PC board at a specified position at a specified horizontal transfer level;

a parts holding device for holding an electronic component at said specified horizontal transfer level with the terminal leads of said electronic component adjacent the terminal electrodes of said PC board;

a feeding device for supplying the electronic component to said parts holding device; and a transfer device for moving the parts holding device towards the side margin of said PC board along said specified horizontal transfer level to fix the terminal electrodes of said PC board between the terminal leads of said electronic component.

2. An apparatus for mounting electronic components according to claim 1, wherein the parts holding device comprises a flat deck for supporting a bottom surface of the electronic component and a vertical face that touches a back surface of the electronic component, when the electronic component is placed with the terminal leads of the electronic component facing to the side margin of the PC board.

3. An apparatus for mounting electronic components according to claim 1, further comprising:

a first storage means for storing electronic components to be affixed to a side margin of the PC board;

a second storage means for storing surface mounting type electronic components to be mounted on an upper or lower surface of the PC board; and a carrying head for picking up the surface mounting type electronic components from the second storage means and mounting the surface mounting electronic components on the upper or the lower surface of the PC board.

4. An apparatus for mounting electric components to a PC board, each electronic component having at least a pair of terminal leads facing each other with said PC board having at least a pair of terminal electrodes positioned opposite each other on opposite surfaces of said PC board at a side margin thereof, comprising:

a carrying device for transferring a PC board from one position to another position along a specified horizontal transfer level;

a pair of guiding devices for guiding the transfer of the PC board along said specified horizontal transfer level;

a positioning device for positioning the PC board at a specified position along said specified horizontal transfer level;

a parts holding device, located in between the pair of guiding devices, for holding an electronic component;

an elevation device for lifting the parts holding device up and down to and from a specified horizontal transfer level to locate the terminal leads of said electronic component adjacent the terminal electrodes of the PC board at said specified horizontal transfer level;

a transfer device for moving the parts holding device towards the side margin of the said PC board along said specified horizontal transfer level to fix the terminal electrodes of said PC board between the terminal leads of said electronic component; and a feeding device for supplying the electronic component to the parts holding device.

5. An apparatus for mounting electronic components according to claim 4, wherein the positioning device is equipped with a bottom supporting device for supporting a bottom surface of the PC board, and wherein the elevation device thrusts the parts holding device up to the specified horizontal transfer level, and pushes the bottom supporting device up to touch the bottom surface of the PC board.

6. An apparatus for mounting electronic components according to claim 4, further comprising:

a first storage means for storing electronic components to be affixed to the side margin of the PC board;

a second storage means for storing surface mounting type electronic components to be mounted on the upper or lower surface of the PC board; and a carrying head for picking up the surface mounting type electronic components from the second storage means and mounting the surface mounting electronic components on the upper or the lower surface of the PC board.

7. A method of mounting electronic components to a PC board, each electronic component having at least a pair of terminal leads facing each other with said PC board having at least a pair of terminal electrodes positioned opposite each other on opposite surfaces of said PC board at a side margin thereof, comprising the steps of:

transferring a PC board along a specified horizontal transfer level to a specified place guided by a pair of guiding devices;

positioning the PC board at a specified position on said specified horizontal transfer level;

mounting surface mounting type electronic components on the PC board positioned at the specified position;

supplying an electronic component to a parts holding device located in between the pair of guiding devices; and affixing the electronic component to a side margin of the PC board by means of the parts holding device by moving said electronic component toward the side margin of said PC board along said horizontal transfer level to fix the terminal electrodes of said PC board between the terminal leads of said electronic component.

8. A method of mounting electronic components to a PC board, each electronic component having at least a pair of terminal leads facing each other with said PC board having at least a pair of terminal electrodes positioned opposite each other on opposite surfaces of said PC board at a side margin thereof, comprising the steps of:

transferring a PC board to a specified position at a horizontal transfer level guided by a pair of guiding devices;

positioning the PC board at a specified position on said specified horizontal transfer level;

mounting surface mounting type electronic components on the PC board positioned at the specified position;

supplying an electronic component to a parts holding device located in between the pair of guiding device;

affixing the electronic component to a side margin of the PC board by means of the parts holding device by moving said electronic component toward the side margin of said PC board along said horizontal transfer level to fix the terminal electrodes of said PC board between the terminal leads of said electronic component;

soldering the surface mounting type electronic components and said electronic component affixed to a side margin of the PC board to the PC board; and electronically inspecting the soldered PC board.

* * * * *